United States Patent
Nakayama

(10) Patent No.: US 6,921,683 B2
(45) Date of Patent: Jul. 26, 2005

(54) SEMICONDUCTOR DEVICE AND MANUFACTURING METHOD FOR THE SAME, CIRCUIT BOARD, AND ELECTRONIC DEVICE

(75) Inventor: Toshinori Nakayama, Sakata (JP)

(73) Assignee: Seiko Epson Corporation, Tokyo (JP)

( * ) Notice: Subject to any disclaimer, the term of this patent is extended or adjusted under 35 U.S.C. 154(b) by 84 days.

(21) Appl. No.: 10/371,441

(22) Filed: Feb. 24, 2003

(65) Prior Publication Data

US 2003/0164549 A1 Sep. 4, 2003

(30) Foreign Application Priority Data

Feb. 25, 2002 (JP) ........................................ 2002-048322

(51) Int. Cl.[7] ......................... H01L 21/44; H01L 21/48; H01L 21/50
(52) U.S. Cl. ........................ 438/122; 438/110; 438/126
(58) Field of Search ............................... 438/122, 110, 438/112, 113, 124, 125, 126, 127; 257/796, 787

(56) References Cited

U.S. PATENT DOCUMENTS

| | | | | |
|---|---|---|---|---|
| 5,485,037 A | * | 1/1996 | Marrs | 257/712 |
| 6,246,115 B1 | * | 6/2001 | Tang et al. | 257/706 |
| 6,278,182 B1 | * | 8/2001 | Liu et al. | 257/712 |
| 6,720,647 B2 | * | 4/2004 | Fukuizumi | 257/704 |

FOREIGN PATENT DOCUMENTS

| | | |
|---|---|---|
| JP | 7-321246 | 12/1995 |
| JP | 11-026658 | 1/1999 |

* cited by examiner

*Primary Examiner*—S. V. Clark
(74) *Attorney, Agent, or Firm*—Mark P. Watson

(57) ABSTRACT

To improve the productivity of manufacturing semiconductor devices having a heat sink, the semiconductor device manufacturing method includes: (a) setting an integral heat radiation body set 30 of multiple heat radiation bodies 32 in a mold 40 cavity 42; (b) setting a substrate 10 on which multiple semiconductor chips 20 are mounted in a planar arrangement in the mold 40 so that the multiple semiconductor chips 20 are located inside the cavity 42; and (c) sealing the multiple semiconductor chips 20 and affixing the heat radiation body set 30 by filling the cavity 42 with a sealant.

26 Claims, 17 Drawing Sheets

SEMICONDUCTOR DEVICE AND MANUFACTURING METHOD FOR THE SAME, CIRCUIT BOARD, AND ELECTRONIC DEVICE

BACKGROUND OF THE INVENTION

1. Field of the Invention

The present invention relates to a semiconductor device and a manufacturing method for the same, a circuit board, and an electronic device.

2. Description of the Related Art

Semiconductor devices having a heat dissipating body commonly called a heat sink are known. A heat sink is disposed with at least part thereof embedded in the sealed part when the semiconductor chip is sealed. A molding process using a mold is typically used for sealing the semiconductor chip. Providing a heat sink improves the heat radiation of the semiconductor device.

Conventional molding processes place one of plural heat sinks cut into individual pieces into one of the cavities used to form the sealed part. This means that multiple individual heat sinks must be handled individually, which cannot be said to offer outstanding productivity.

OBJECTS OF THE INVENTION

The present invention is directed to solving this problem and an object of the invention is to improve the productivity of manufacturing semiconductor devices having a heat dissipating body.

SUMMARY OF THE INVENTION (1) A manufacturing method for a semiconductor device according to the present invention includes: (a) setting an integral set of multiple heat radiation bodies in a mold cavity; (b) setting a substrate on which multiple semiconductor chips are mounted in a planar arrangement in the mold so that the multiple semiconductor chips are located inside the cavity; and (c) sealing the multiple semiconductor chips and affixing the set of multiple heat radiation bodies by filling the cavity with a sealant.

By thus setting an integral set of multiple heat radiation bodies in the mold, the multiple heat radiation bodies can be affixed en masse to the substrate. By thus positioning the multiple heat radiation bodies, for example, en masse to multiple semiconductor chips, the productivity of manufacturing semiconductor devices having a heat sink can be improved.

(2) In a further manufacturing method for a semiconductor device the heat radiation body part of the heat radiation body set is placed in contact with a bottom surface of the mold cavity in step (a).

This enables the side of the heat sinks facing away from the substrate to be exposed from the sealant, thus improving heat radiation from the semiconductor chip. Furthermore, because the sealant does not penetrate the area where the heat sink set contacts the mold, the mold needs less frequent cleaning because the sealant does not adhere to the mold.

(3) In a further manufacturing method for a semiconductor device a raised lip is formed at the outside of the heat radiation body set, and in step (a) the heat radiation body part of the heat radiation body set is raised above the bottom of the mold cavity by the raised lip.

This enables the heat sinks to be covered with the sealant on the side facing away from the substrate.

(4) In a further manufacturing method for a semiconductor device a protuberance is formed in the heat radiation body part of the heat radiation body set, and in step (a) the heat radiation body set is placed with the protuberance facing the open side of the cavity.

The protuberant parts of the heat sinks can thus be disposed facing the semiconductor chips. The distance between the heat sink and semiconductor chip can thereby be reduced and heat radiation from the semiconductor chip further improved.

(5) The protuberant parts of the heat sinks can be formed by a half-etching process in this semiconductor device manufacturing method.

(6) Yet further preferably at least one surface of the heat radiation body set is made a rough surface in this semiconductor device manufacturing method.

One or both sides of the heat radiation body set can have a rough surface. The exposed area of the heat sink can be increased if the part of the heat sink exposed from the sealant is rough, thereby improving heat radiation from the semiconductor chip. Adhesion between the heat sink and the sealant can also be improved if the part of the heat sink contacting the sealant is rough.

(7) Yet further preferably a plurality of through-holes is formed in the heat radiation body part of the heat radiation body set in this semiconductor device manufacturing method.

The sealant can then penetrate these through-holes to further improve adhesion between the heat sinks and sealant.

(8) Yet further preferably this semiconductor device manufacturing method has an additional step (d) for producing individual pieces having a heat radiation body by cutting the sealed part and substrate together with the heat radiation body set after step (c).

(9) Yet further preferably this semiconductor device manufacturing method forms ribs or protruding parts with a substantially continuous longitudinal section in the heat radiation body set along the cutting lines followed in step (d), and exposes the heat radiation body at the top part and side part of the individual pieces by cutting the ribs or protruding parts in step (d).

(10) Yet further preferably this semiconductor device manufacturing method forms support parts for interconnecting multiple heat radiation bodies and suspending the heat radiation bodies in part in the heat radiation body set.

This enables the heat sinks to be positioned relative to a flat part of the semiconductor devices. The weight and size of the semiconductor devices can therefore be reduced. The heat sinks can also be located away from the wires bonded to the semiconductor chips, for example. The heat sink can therefore be prevented from interfering with electrical signals passing through the wires.

(11) Yet further preferably in this semiconductor device manufacturing method support parts are formed to intersect the cutting lines followed in step (d), and in step (d) the support parts of the heat radiation body set are cut.

The heat radiation body set can be easily cut by cutting the support parts intersecting the cutting lines, thereby helping to improve the stability of semiconductor device quality.

(12) Yet further preferably in this semiconductor device manufacturing method an outside frame for the heat radiation bodies, and support parts for connecting the heat radiation bodies and outside frame and supporting the heat radiation bodies in part, are formed in the heat radiation body set.

The outside frame of the heat sink is thus formed in the heat radiation body set. This assures strength in the heat radiation body set and makes handling the set easier.

(13) Yet further preferably in this semiconductor device manufacturing method the outside frame extends along the cutting lines followed in step (d), and in step (d) the outside frame part of the heat radiation body set is cut.

(14) Yet further preferably in this semiconductor device manufacturing method the outside shape of the semiconductor chips is square-shaped, and the support parts are formed at positions corresponding to corners of the semiconductor chips.

(15) Yet further preferably in this semiconductor device manufacturing method the outside shape of the heat radiation body part of the heat radiation body set is square-shaped, and the support parts suspend multiple corner parts in the heat radiation body part of the heat radiation body set.

(16) Yet further preferably in this semiconductor device manufacturing method the heat radiation body parts of the heat radiation body set are shifted in a specific direction by the support parts, and in step (a) the side to which the heat radiation bodies are shifted is set facing the open side of the cavity.

This enables the side of the heat sinks facing away from the substrate to be covered with sealant. Furthermore, because the heat sinks can be located closer to the semiconductor chips, heat radiation from the semiconductor chips can be improved.

(17) A semiconductor device according to the present invention is manufactured by any of the manufacturing methods described above.

(18) A further semiconductor device according to the present invention has a substrate; a plurality of semiconductor chips mounted in a planar arrangement on the substrate; a sealed part formed by sealing the multiple semiconductor chips on the substrate en masse; and a heat radiation body set containing multiple integrally formed parts that are heat radiation bodies for the semiconductor chips.

(19) The heat radiation body set is preferably exposed from the sealed part on the side thereof facing away from the substrate in this semiconductor device.

(20) Alternatively, at least part of the heat radiation body set is covered by the sealed part on the side facing away from the substrate in this semiconductor device.

(21) A circuit board according to the present invention has at least one semiconductor device according to the present invention mounted thereon.

(22) An electronic device according to the present invention uses at least one semiconductor device according to the present invention.

Other objects and attainments together with a fuller understanding of the invention will become apparent and appreciated by referring to the following description and claims taken in conjunction with the accompanying drawings.

The following lists some of the key elements shown in the figures:

| | |
|---|---|
| 10 | substrate |
| 20 | semiconductor chip |
| 30 | heat sink set |
| 32 | heat sink |
| 40 | mold |
| 42 | cavity |
| 44 | bottom |
| 50 | sealed part |
| 60 | heat sink set |
| 62 | heat sink |
| 70 | heat sink set |
| 72 | heat sink |
| 80 | heat sink set |
| 82 | heat sink |
| 84 | through-holes |
| 90 | heat sink set |
| 92 | heat sinks |
| 94 | lands or protuberances |
| 100 | heat sink set |
| 102 | heat sink |
| 104 | lip |
| 110 | heat sink set |
| 112 | heat sinks |
| 113 | top part |
| 114 | ribs |
| 115 | side part |
| 120, 130, 140, 150 | heat sink sets |
| 122, 132, 142, 152 | heat sinks |
| 124, 134, 144, 154 | supports |
| 126, 136, 146 | outside frame |
| 138 | lip |

DESCRIPTION OF THE PREFERRED EMBODIMENTS

Preferred embodiments of the present invention are described below with reference to the accompanying figures. The invention shall not, however, be limited to the following embodiments.

Embodiment 1

Figure 1:
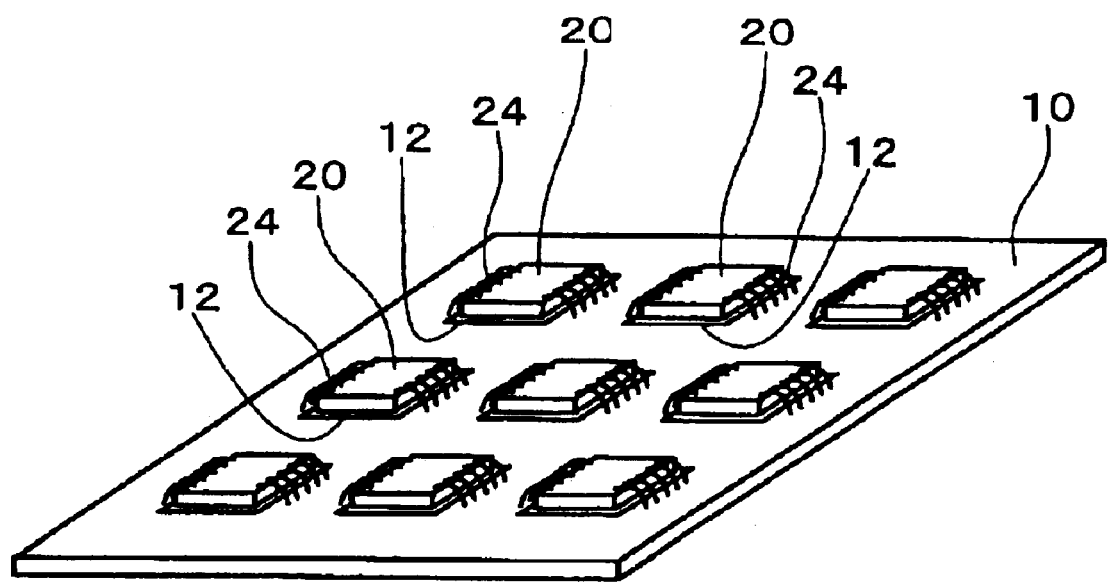
FIG. 1 is a perspective view showing a first embodiment of the invention with the semiconductor chips mounted on the substrate.

FIG. 1 to FIG. 6 show a manufacturing method for a semiconductor device according to a first embodiment of the invention. First, as shown in FIG. 1, multiple semiconductor chips 20 are mounted on a substrate 10. The substrate 10 is the interposer of the individual semiconductor devices.

The substrate 10 could be made from organic materials (such as a polyimide substrate) or inorganic materials (a ceramic or glass substrate, for example), or a hybrid (a glass-epoxy substrate, for example). The planar shape of the substrate 10 is not particularly limited but is typically rectangular as shown in FIG. 1. The substrate 10 could further be a single or multiple layer substrate.

Multiple mounting areas 12 are disposed on the substrate 10 for mounting multiple semiconductor chips 20. The mounting areas 12 are formed on either one or both sides of the substrate 10. In the example shown in FIG. 1 the multiple mounting areas 12 are formed in a matrix pattern of multiple rows and columns on the surface of the substrate 10.

A wiring pattern 14 (see FIG. 3) with multiple lines is also formed on the substrate 10. More specifically, a wiring pattern 14 is formed in each mounting area 12. Multiple through-holes 16 (see FIG. 3) may also be formed in the substrate 10 for electrically connecting one side to the other. The through-holes 16 can be filled with a conductive material, or the inside walls of the through-holes 16 can be plated with a conductive material. This enables electrical connections to be made from both sides of the substrate 10.

The shape of the semiconductor chips 20 is not specifically limited, but is typically a rectangular parallelopiped (including a cube). The semiconductor chip 20 is an integrated circuit composed, for example, of multiple transistors and memory elements, which details are not shown in the figures. Each semiconductor chip 20 also has at least one (and typically multiple) electrode (not shown in the figure) enabling electrical connection to the integrated circuits. The electrodes can be formed on two or four outside edges of the semiconductor chip 20 surface, for example, and can be formed in the center of the surface. The electrodes are formed from a metal such as aluminum, copper, or various alloys. A passivation film (not shown in the figure) is formed covering the ends of the electrodes but not the middle. The passivation film could be formed from, for example, $SiO_2$, SiN, or a polyimide resin.

As shown in FIG. 1, a semiconductor chip 20 is mounted in each of the multiple mounting areas 12 on the substrate 10. The multiple semiconductor chips 20 are placed flat on the substrate 10 and bonded with the electrodes facing up (face-up bonding). The semiconductor chip 20 can be bonded to the substrate 10 with adhesive.

Figure 3:
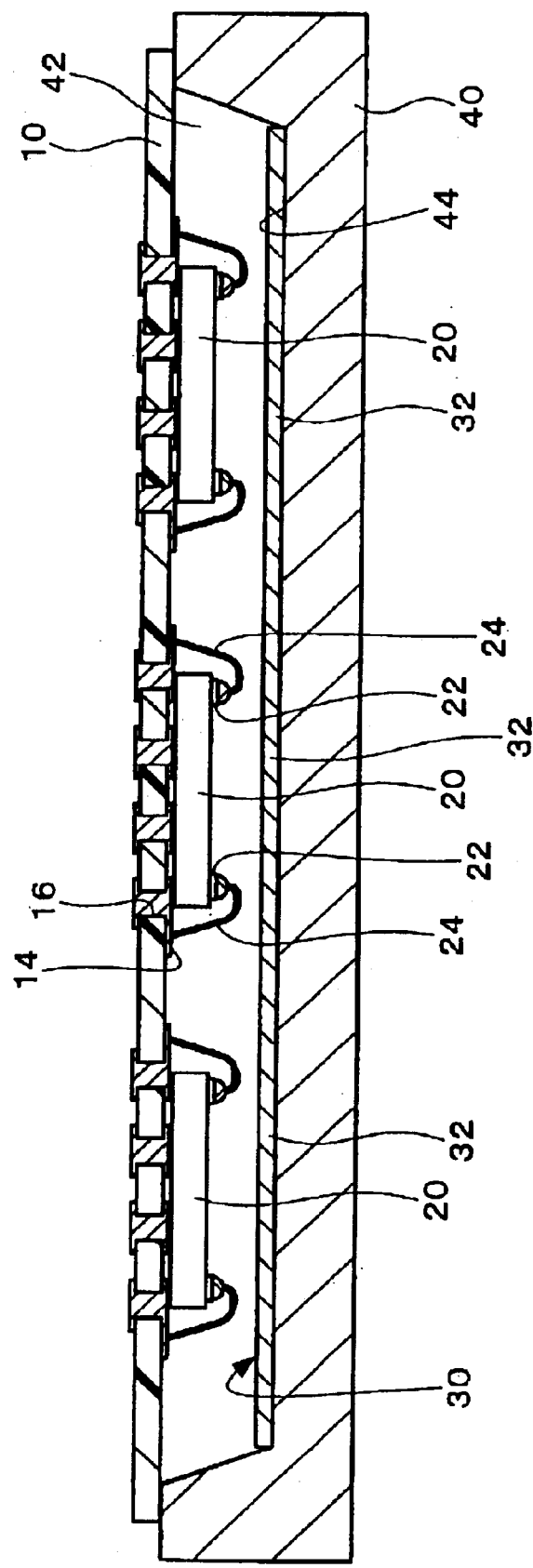
FIG. 3 is a cross-sectional view showing a first embodiment of the invention with the semiconductor chips mounted on the substrate and the heat sink set in the mold cavity.

As shown in FIG. 3 the semiconductor chip 20 is electrically connected to the wiring pattern 14. Wire 24 can be used to make the electrical connection, in which case a ball bump method can be used. More specifically, the tip of the wire 24 drawn outside the tool (such as a capillary) is melted into a ball and thermally bonded to the contact (preferably also using ultrasonic vibration) to electrically connect the wire 24 to the electrode 22. After the wire 24 is bonded to the electrode 22 of the semiconductor chip 20, it is then bonded to the wiring pattern 14 of the substrate 10, for example. In this case a bump is formed on the electrode 22 as shown in FIG. 3.

Figure 2:
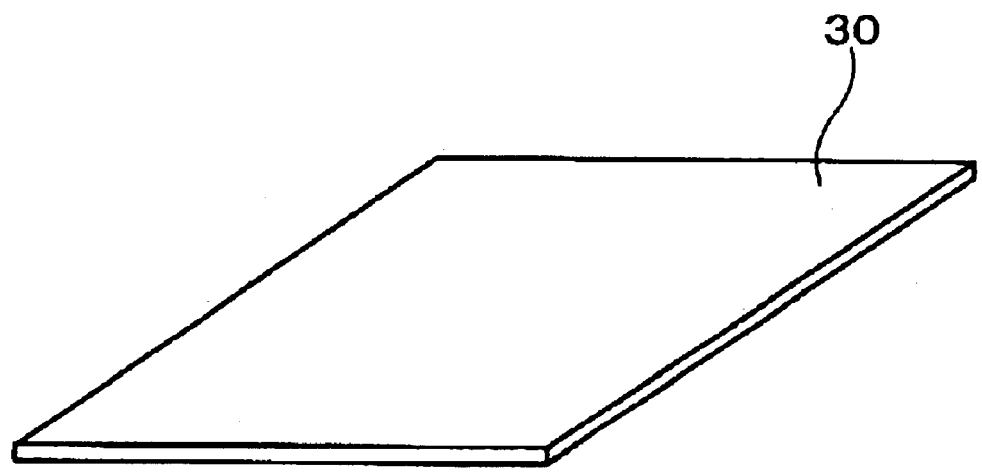
FIG. 2 is a perspective view showing the heat sink set formed as a sheet in a first embodiment of the invention.

A heat sink set 30 of multiple heat radiating bodies for dissipating heat from the semiconductor chip 20 is prepared as shown in FIG. 2. The multiple heat dissipating bodies 32 (each corresponding in location to a semiconductor chip as seen in FIG. 3) are integrally formed. When the heat sink set 30 is cut in a later process it becomes the heat dissipating body 32 of an individual semiconductor chip 20 (see FIG. 6). The resulting heat dissipating bodies 32 can also be called heat sinks and are referred to as such below. The heat sink set 30 is preferably made from a material suitable for heat exchange, but the material itself is not specifically limited. It could, for example, be a copper or iron alloy. In the example shown in FIG. 2 the heat sink set 30 is formed as a sheet. This simplifies processing and thereby helps reduce the cost. The heat sink set 30 can be formed by processing a single monolithic member, or by integrally combining multiple members. It can, for example, be chemically processed by half-etching or plating (electrolytic or electroless plating), or mechanically processed by pressing or cutting.

A metal film (such as a plated film) not shown in the figures may be formed on the heat sink set 30. A metal film could, for example, be formed on the externally exposed part (the part exposed from the sealed part in FIG. 4) of the heat sink set 30. Nickel plating could be used as the metal film if the heat sink set 30 is made from a copper material, for example. This improves the thermal conductivity of the heat sink set 30 (heat sinks 32).

In this embodiment of the invention the multiple semiconductor chips 20 on the substrate 10 are sealed and the heat sink set 30 is fixed to the substrate 10 using a mold 40.

The mold 40 has a cavity 42. The mold 40 could be a die. The cavity 42 is formed to a size (width and depth) capable of housing the multiple semiconductor chips 20. The bottom 44 of the cavity 42 can be a flat surface.

As shown in FIG. 3 the heat sink set 30 is set in the cavity 42 of the mold 40. If the planar shape of the heat sink set 30 conforms to the planar shape of the cavity 42 (such as the shape of the bottom 44) by, for example, forming both with the same shape, the heat sink set 30 can be easily positioned in the cavity 42 by simply dropping it into the cavity 42.

In the example shown in FIG. 3 the heat sink set 30, and more specifically the part thereof that becomes the heat sinks 32, is set in contact with the bottom 44 of the mold 40. More specifically, the heat sink set 30 is placed with one side thereof contacting the bottom 44 of the cavity 42. This enables the side of the heat sinks 32 facing away from the substrate 10 to be exposed from the sealant. Heat radiation from the semiconductor chip 20 can therefore be improved. Furthermore, because the sealant does not penetrate the area where the heat sink set 30 contacts the mold 40, the mold 40 needs less frequent cleaning due to adhesion of the sealant to the mold 40.

The substrate 10 is placed in the mold 40 next. In this case the multiple semiconductor chips 20 are placed inside the cavity 42. The multiple semiconductor chips 20 are then sealed in one step by flowing sealant into the cavity 42. The sealant is preferably a resin, in which case it can be called a molding resin. Productivity can be improved by thus sealing the multiple semiconductor chips 20 at once.

A sealant is thus disposed between the multiple semiconductor chips 20 and the heat sink set 30. The heat sink set 30 is bonded to the sealant. More specifically, the heat sink set 30 can be bonded to the substrate 10 by filling the space therebetween with sealant.

Figure 4:
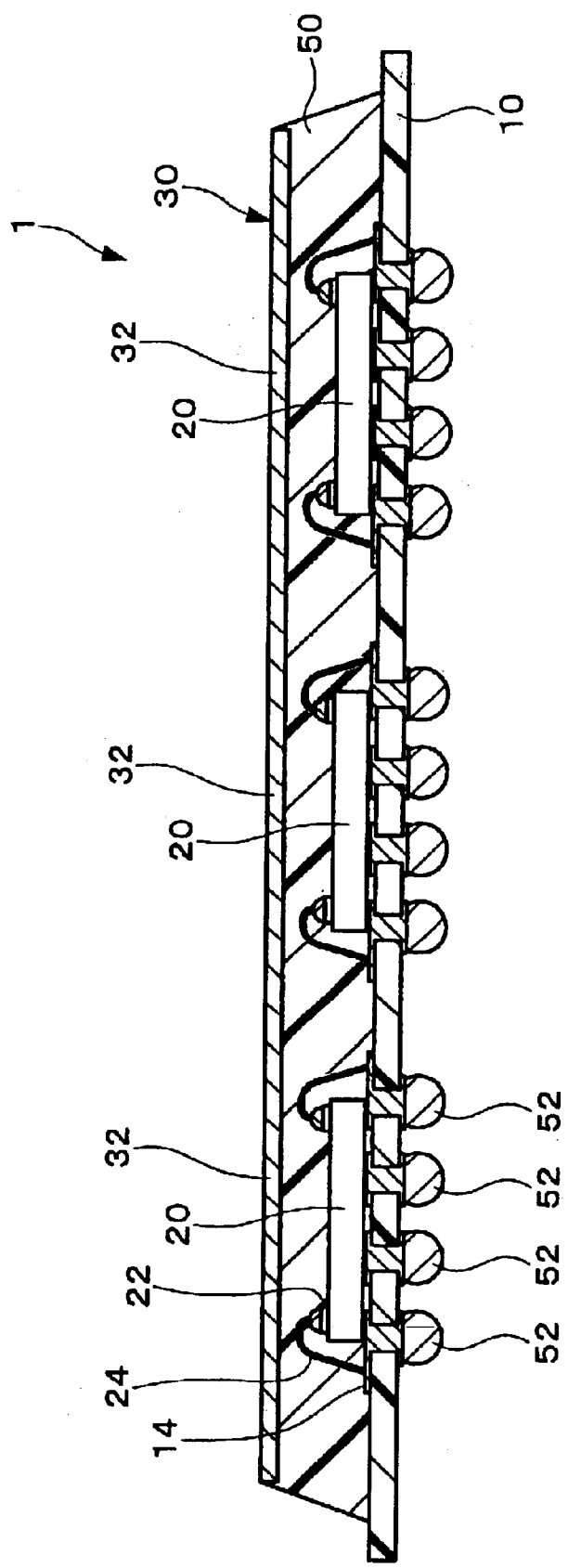
FIG. 4 is a cross-sectional view showing a first embodiment of the invention with a semiconductor device incorporating multiple semiconductor chips.

A semiconductor device 1 incorporating multiple semiconductor chips 20 as shown in FIG. 4 can thus be manufactured. The semiconductor device 1 includes a substrate 10, the multiple semiconductor chips 20, sealant 50 sealing the multiple semiconductor chips 20, and a heat sink set 30 integrally forming the multiple heat sinks 32. In the example shown in FIG. 4 the side of the heat sink set 30 away from the substrate 10 is exposed from the sealant 50. The semiconductor device 1 can be diced in a later process into individual components. In other words, the semiconductor device 1 shown in FIG. 4 is an intermediate product for manufacturing multiple individual semiconductor devices 3 (see FIG. 6).

A plurality of external electrodes 52 can be positioned on the substrate 10 as shown in FIG. 4 before the step of dicing the semiconductor device 1. Excellent productivity is achieved by thus forming the external electrodes 52 for multiple semiconductor devices 3 in one step. The external electrodes 52 can be solder balls, and can be positioned on lands in the wiring pattern 14 of the substrate 10. In the example shown in FIG. 4 the external electrodes 52 are located at the through-holes.

Figure 5:
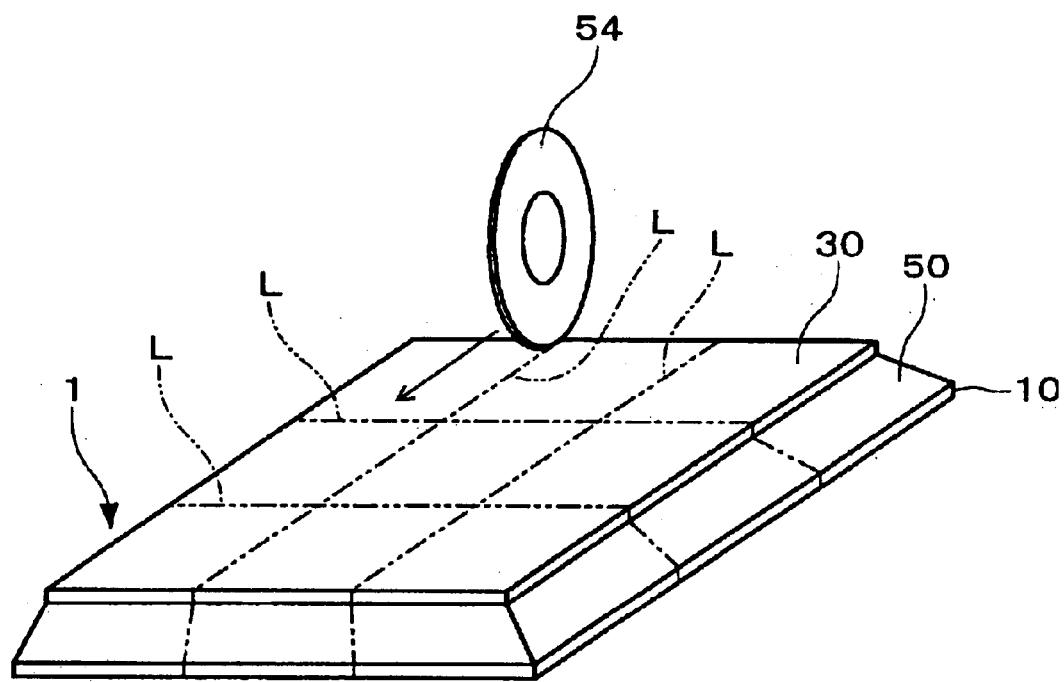
FIG. 5 is a perspective view showing a first embodiment of the invention in which the semiconductor device incorporating the multiple semiconductor chips 20 is sliced.

The semiconductor device 1 incorporating the multiple semiconductor chips 20 is then sliced as shown in FIG. 5. More specifically, the sealant 50 and substrate 10 are cut completely through the heat sink set 30 using a cutting tool 54 (such as a blade used for cutting a silicon wafer). The semiconductor device 1 can be cut from the heat sink set 30 side as shown in FIG. 5 or from the substrate 10 side. Pre-forming cutting lines L (indicated by the broken lines in FIG. 5) makes it easier to position the semiconductor device 1 for slicing.

Figure 6:
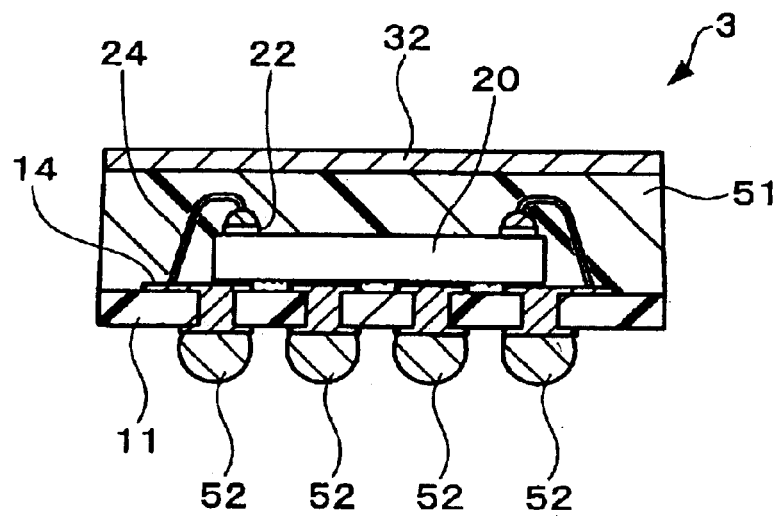
FIG. 6 is a cross-sectional view showing a first embodiment of the invention with individual semiconductor devices 3 each having a heat sink.

Individual semiconductor devices 3 each having a heat sink 32 as shown in FIG. 6 can thus be manufactured. Each semiconductor device 3 has a substrate 11 (part of substrate 10), semiconductor chip 20, sealed part 51 (part of sealant 50) sealing the semiconductor chip 20, and heat sink 32 (part of heat sink set 30). In the example shown in FIG. 6 the heat sink 32 is exposed from the sealed part 51 at the side facing away from the substrate 11.

It is thus possible using the semiconductor device manufacturing method according to this embodiment of the invention to mount multiple heat sinks 32 to a substrate 10 in one step by placing a heat sink set 30 containing multiple heat sinks 32 in the mold 40. It is therefore possible to, for example, position multiple heat sinks 32 relative to multiple semiconductor chips 20 in one step, and thereby improve the productivity of manufacturing semiconductor devices having a heat sink 32.

A semiconductor device according to this embodiment of the invention includes any configuration derived from any selected elements of the manufacturing method described above, and a semiconductor device according to this embodiment of the invention will have the same effects and benefits described above. As shown in FIG. 4, a semiconductor device according to this embodiment of the invention includes devices manufactured by the process of the above-described manufacturing method.

The present invention shall not be limited to this embodiment and can be varied in many ways. Those parts (including the construction, operation, function, and effect) of the embodiments described below common to the above-described embodiment are omitted in the following descriptions. It should be noted that the present invention also includes configurations that can be achieved by combining parts of multiple embodiments.

Embodiment 2

Figure 7:
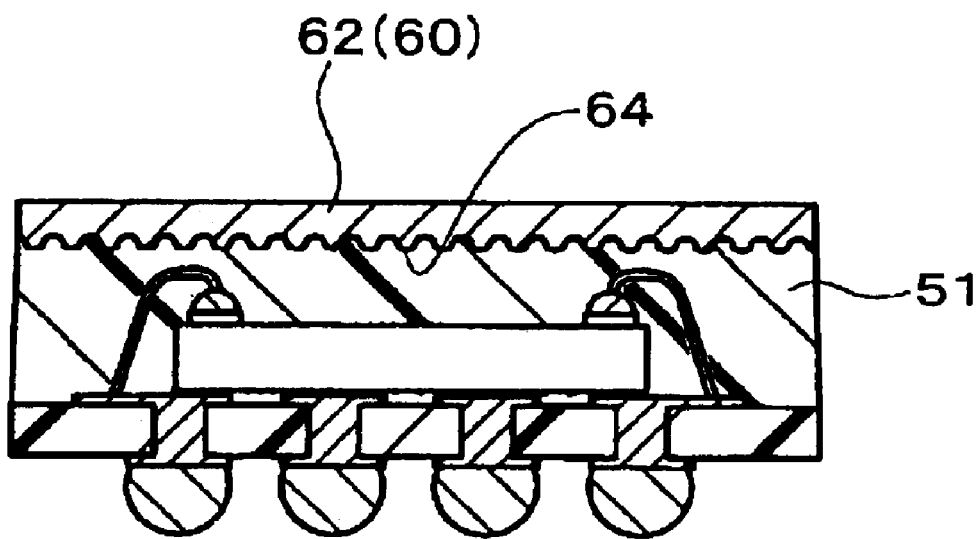
FIG. 7 is a cross-sectional view showing a second embodiment of the invention with the heat sink set or heat sink having one or more rough surfaces.
Figure 8:
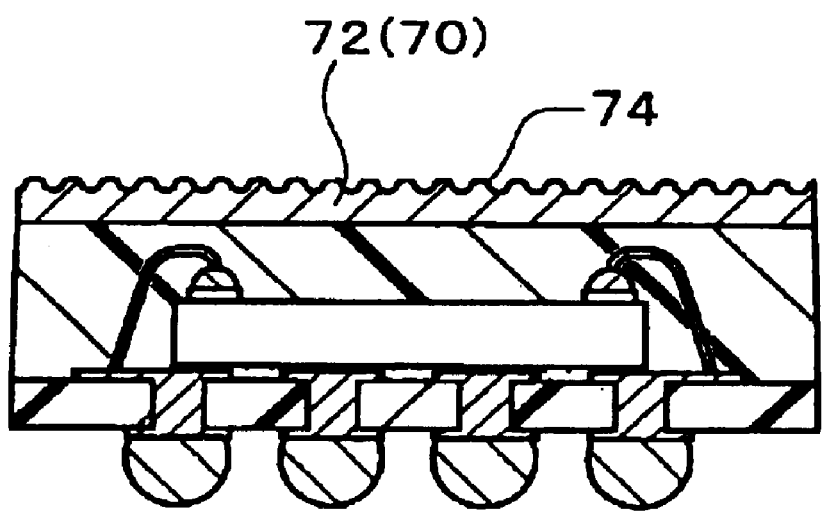
FIG. 8 is a cross-sectional view showing an alternative of the second embodiment of the invention with the heat sink set or heat sink having one or more rough surfaces.

FIG. 7 and FIG. 8 show a single semiconductor device according to a second embodiment of the invention. This embodiment differs from the above in the configuration of the heat sink set (shown in FIG. 7 and FIG. 8 as the heat sink after slicing). More specifically, one or both surfaces of the heat sink set are rough surfaces.

As shown in FIG. 7 the surface 64 of heat sink set 60 facing the substrate 10 can be rough. The surface 64 of heat sink set 60 can be roughened so as to remove the smoothness mechanically by sandblasting, physically using plasma, UV radiation, or ozone, for example, or chemically using an etchant. The surface could also be roughened by dimpling. It should be noted that it is sufficient to roughen the heat sink 62 part of the heat sink set 60.

With this configuration the side of the heat sink set 60 (or heat sink 62) facing the substrate 10 is the part that contacts the sealant (or sealed part 51). This increases the bonding area between the heat sink set 60 and sealant, increases the physical and chemical bond strength, and improves adhesion therebetween.

As shown in FIG. 8 the surface 74 of the heat sink set 70 facing away from the substrate 10 can be roughened. In the example shown in FIG. 8 the roughened surface 74 of the heat sink set 70 is exposed from the sealant. It is sufficient in this case for the heat sink 72 part of the heat sink set 70 to have a rough surface.

The exposed area of the heat sink can be increased by thus making the surface 74 of the heat sink set 70 (or heat sink 72) facing away from the substrate 10 rough. Heat radiation from the semiconductor chip can thereby be further improved.

While not shown in the figures it is also possible to make both surfaces of the heat sink set (at least in the parts that become heat sinks) rough. This will improve both adhesion and heat radiation as described above.

Embodiment 3

Figure 9:
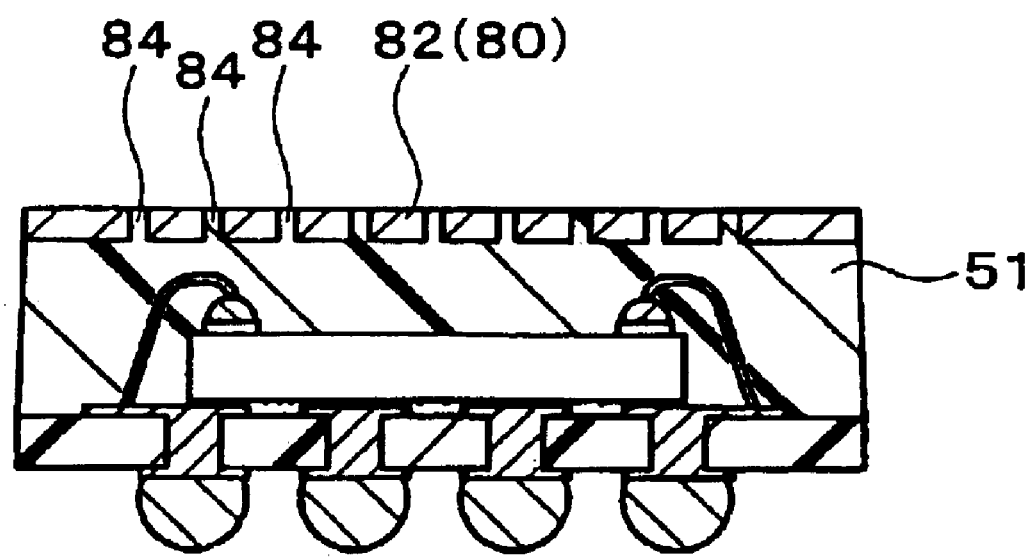
FIG. 9 is a cross-sectional view showing a third embodiment of the invention with multiple through-holes formed at least in the parts of the heat sink set that form the heat sinks.

FIG. 9 shows a single semiconductor device according to a third embodiment of the invention. In this embodiment a plurality of through-holes 84 are formed in the heat sink set 80 (in the heat sink 82 after cutting in FIG. 9). These through-holes 84 pass through from the surface of the heat sink set 80 facing the substrate 10 to the opposite surface of the heat sink set 80, and are formed at least in the parts of the heat sink set 80 that become the heat sinks 82. The multiple through-holes 84 can be formed chemically by etching or physically or mechanically using a drill, for example.

Adhesion between the heat sink set 80 (or heat sink 82) and sealant (or sealed part 51) is improved by forming these through-holes 84 in the heat sink set 80 because the sealant also enters the through-holes 84.

Embodiment 4

Figure 10:
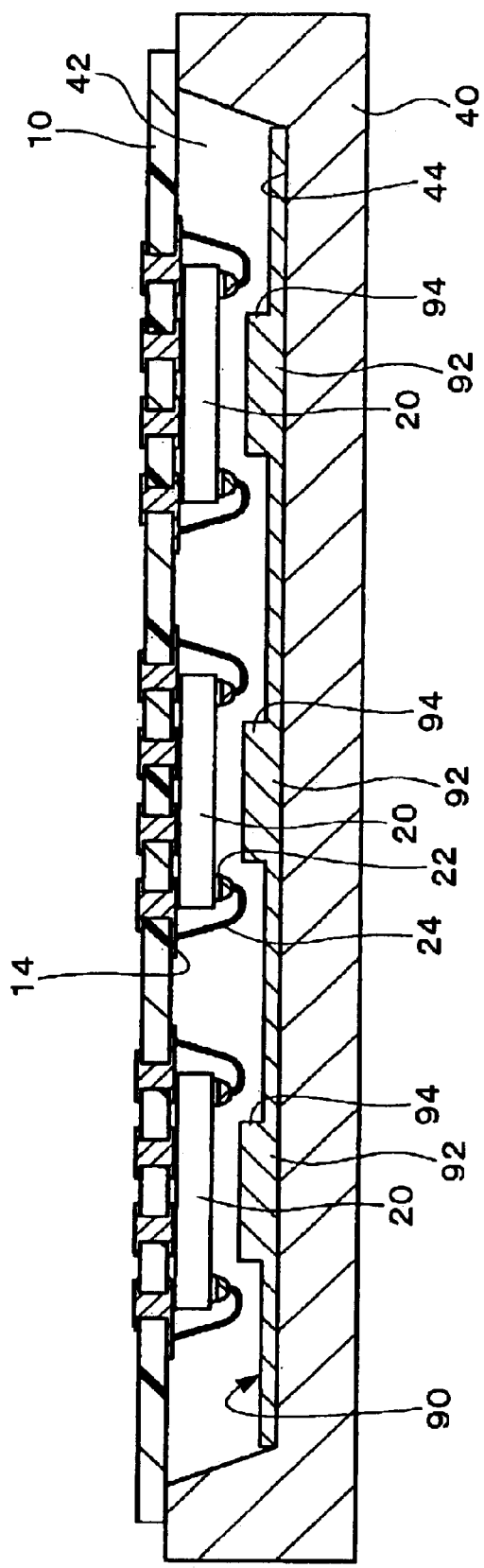
FIG. 10 is a cross-sectional view showing a fourth embodiment of the invention with protruding lands formed on the heat sink set.
Figure 11:
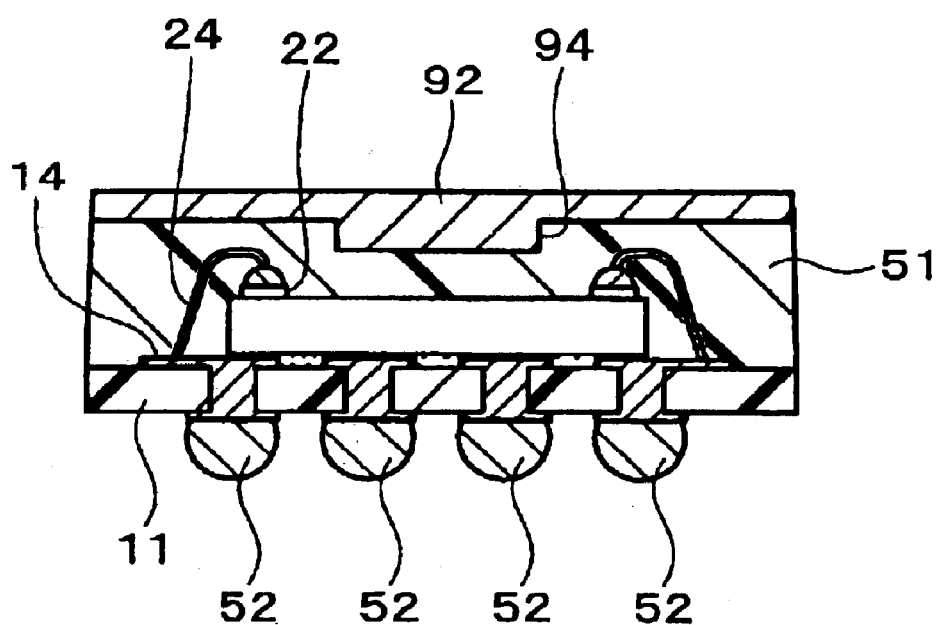
FIG. 11 is a cross-sectional view showing a fourth embodiment of the invention with protruding lands formed on the heat sink set.

FIG. 10 and FIG. 11 show a manufacturing method for a semiconductor device according to a fourth embodiment of the invention. In this preferred embodiment protruding lands 94 are formed on the heat sink set 90.

As shown in FIG. 10 the heat sink set 90 is placed in the cavity 42 of the mold 40 with the lands 94 facing the open side of the cavity 42. That is, the lands 94 face the semiconductor chips 20. Lands 94 may be referred to herein as protuberances or protruding parts.

The lands 94 are formed on the parts of the heat sink set 90 that become the multiple heat sinks 92. Each land 94 is thus formed so that it is opposite one of the multiple semiconductor chips 20. The planar area of the land 94 may be less than the surface area of the semiconductor chip 20. For example, if multiple electrodes 22 are formed along each side of the semiconductor chip 20 as shown in FIG. 10, the lands 94 are formed so as to fit inside the area enclosed by the multiple electrodes 22. Contact between the heat sink set 90 and wires 24 can thus be avoided because the lands 94 can be located away from the wires 24.

Heat radiation from the semiconductor chip 20 can also be improved because the thickness of part of the heat sink 92 can be increased by the lands 94 without being limited by the height of the wire 24 loops. It will also be noted that the lands 94 can be positioned as shown in FIG. 10 so that they do not contact the surface of the semiconductor chip 20.

The lands 94 can be formed on the heat sink set 90 using a half-etching method, for example, or by plating. In both cases the heat sink set 90 is a single member. The lands 94 could also be positioned on the heat sink set 90 by fixing a separate member (of the same or different material) to the parts of the heat sink set 90 that will be the heat sinks 92. In this case the two parts can be fixed together by welding, bonding, or mechanical joining (such as crimping or caulking).

Other specific processes such as sealing and slicing are then performed to produce the individual semiconductor devices as shown in FIG. 11.

In this embodiment of the invention the lands 94 of the heat sinks 92 face the semiconductor chip 20. Heat radiation from the semiconductor chip 20 can thus be further improved because the distance between the heat sinks 92 and semiconductor chip 20 is shortened.

Embodiment 5

Figure 12:
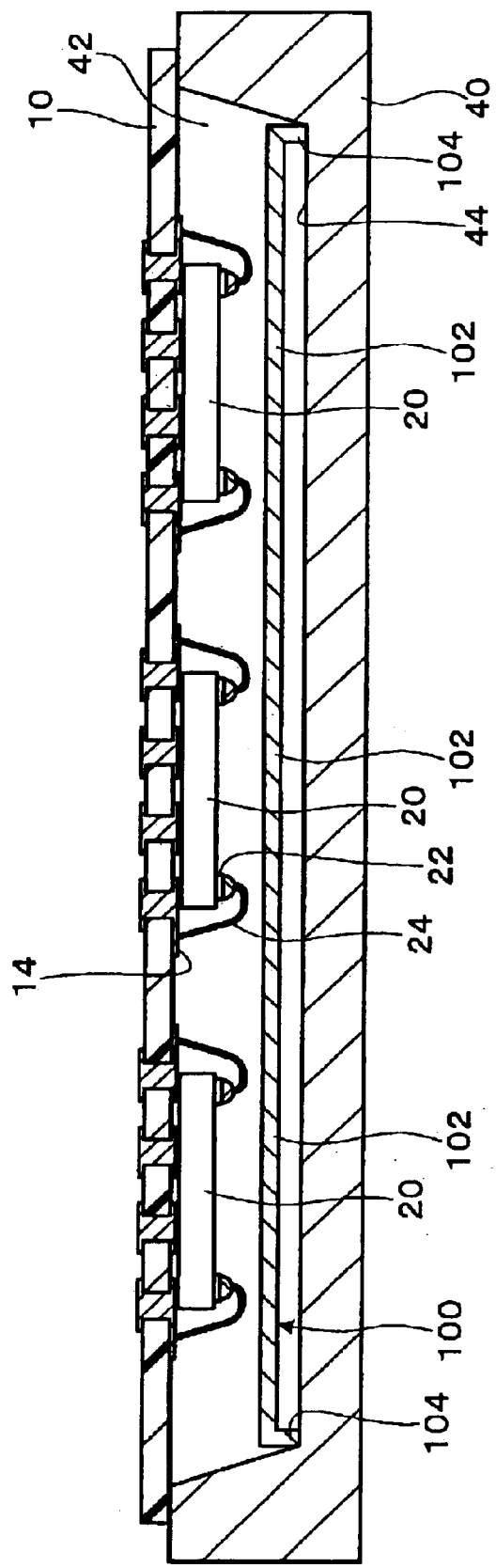
FIG. 12 is a cross-sectional view showing a fifth embodiment of the invention with a lip formed on the outside edge of the heat sink set.
Figure 13:
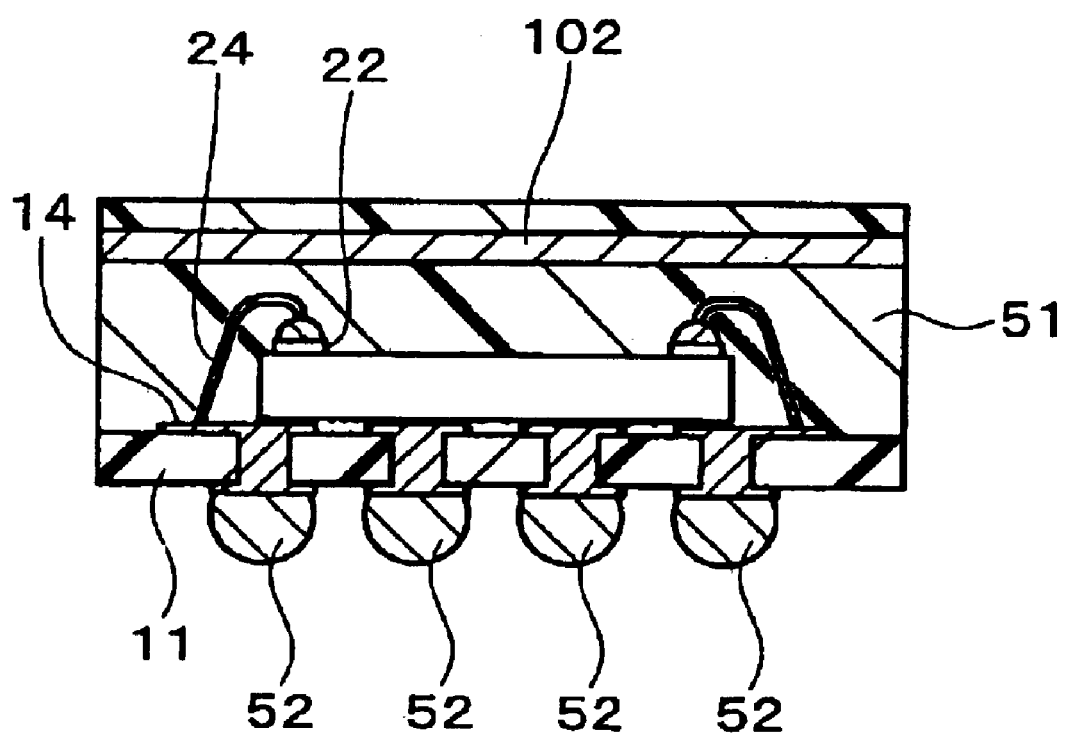
FIG. 13 is a cross-sectional view showing a fifth embodiment of the invention with the heat sink raised off the bottom of the mold cavity.

FIG. 12 and FIG. 13 show the manufacturing method of a semiconductor device according to a fifth embodiment of the invention. A lip 104 is formed on the outside edge of the heat sink set 100 in this embodiment. A raised edge is thus formed around the outside portion of the heat sink set 100.

As shown in FIG. 12 the heat sink 102 parts of the heat sink set 100 are raised above the bottom 44 of the cavity 42 by the lip 104. In the example shown in FIG. 12 the heat sink set 100 does not touch the bottom 44 of the cavity 42 except at the lip 104.

The lip 104 can be formed around the entire perimeter of the heat sink set 100 or only in parts, such as the corners or only two sides of a rectangular heat sink set 100. The lip 104 can be formed from a single part by a half-etching method, plating, or mechanical drawing, for example. The lip 104 could also be provided by fixing a separate member (of the same or different material) to the outside edge of the heat sink set 100.

Other processes such as sealing and dicing are then performed to obtain the individual semiconductor devices as shown in FIG. 13. Because the mold cavity is filled with sealant while the heat sink 102 is raised off the bottom 44 of the cavity 42, the heat sink 102 can also be covered with sealant on the side facing away from the substrate 10 as shown in FIG. 13. The heat radiation of the semiconductor chip 20 can thus be improved even without externally exposing the heat sink 102. It should be noted that as shown in FIG. 13 the heat sink 102 may be exposed from a side part of the semiconductor device.

Embodiment 6

Figure 14:
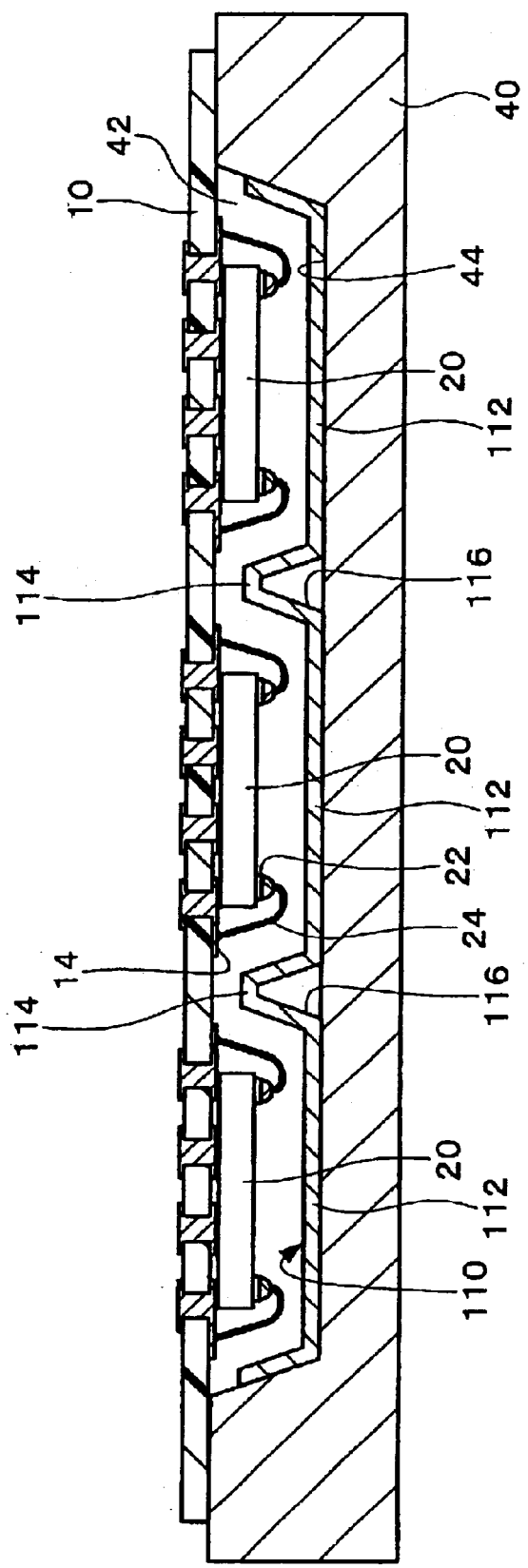
FIG. 14 is a cross-sectional view showing a sixth embodiment of the invention with ribs formed on the heat sink set.
Figure 15:
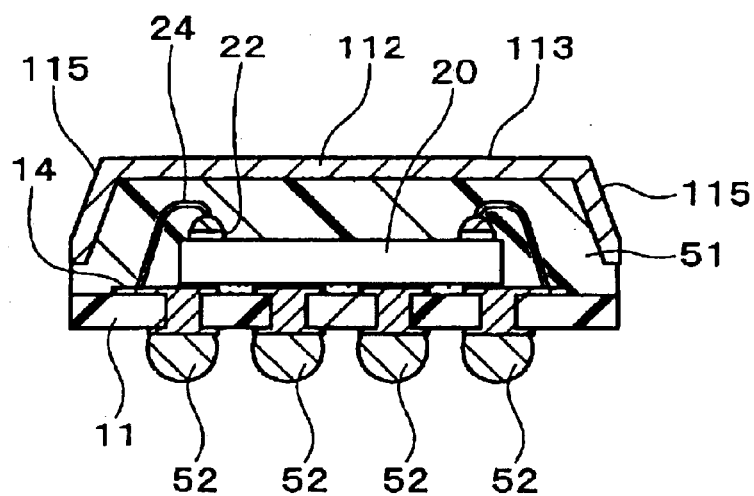
FIG. 15 is a cross-sectional view showing a sixth embodiment of the invention with the heat sink forming part of a frustum of a pyramid to surround the semiconductor chip.

FIG. 14 and FIG. 15 show a manufacturing method for a semiconductor device according to a sixth embodiment of the present invention. This embodiment has ribs 114 with a substantially continuous shape in the longitudinal section formed on the heat sink set 110 along the cutting lines L (see FIG. 5). More specifically, in a plan view of the heat sink set 110 the ribs 114 form strips of a specific width along the dicing lines L, and the areas bordered by the ribs 114 form the heat sinks 112. The width of the ribs 114 is preferably greater than the thickness of the blade of the cutting tool 54 (see FIG. 5) used in the dicing process. This makes it possible to easily cut along the center axis of the ribs 114.

As shown in FIG. 14 the ribs 114 are set facing the open side of the cavity 42 in the mold 40, that is, facing the substrate 10. In the example shown in FIG. 14 the ribs 114 are tapered to a narrow end.

As also shown in FIG. 14 valleys 116 are formed in the heat sink set 110 on the side opposite the ribs 114. These valleys 116 also have substantially continuous profile in longitudinal section. In other words, the valleys 116 form trenches along the dicing lines L when seen in a plan view of the heat sink set 110. In the example shown in FIG. 14 the valleys 116 are tapered in from a wide mouth. If the heat sink set 110 is then diced from the valley 116 side thereof, the blade of the cutting tool 54 can be easily aligned with the center axis of the valley 116 (or rib 114), and the heat sink set 110 can be easily accurately cut. It should be noted that the valleys 116 do not need to be filled with sealant.

The ribs 114 (and valleys 116) can be formed on the heat sink set 110 from a single piece by mechanical drawing. Separate parts could alternatively be fastened to the heat sink set 110 to form the ribs 114 (and valleys 116).

The individual semiconductor devices as shown in FIG. 15 can then be obtained by performing other specific processes, such as sealing and dicing. Because the ribs 114 (and valleys 116) are cut in the dicing process, the heat sink 112 is exposed at the top 113 and sides 115 of the individual semiconductor device. In the example shown in FIG. 15 the heat sink 112 forms part of a frustum of a pyramid. The heat sinks 112 could alternatively form part of a sphere, such as a hemisphere.

Because the heat sink 112 thus surrounds the semiconductor chip 20, heat radiation from the semiconductor chip 20 can be further improved. Furthermore, the location of the dicing lines L can be easily recognized by providing the valleys 116, and positioning for cutting is easier.

Embodiment 7

FIG. 16 to FIG. 21 show a manufacturing method for a semiconductor device according to a seventh embodiment of the invention. In this embodiment the heat sink set 120 includes multiple heat sinks 122, supports 124 for partially suspending each heat sink 122, and outside heat sink frame 126. The configuration of the heat sink set 120 in this embodiment is similar to a lead frame used for packaging semiconductor devices.

Figure 16:
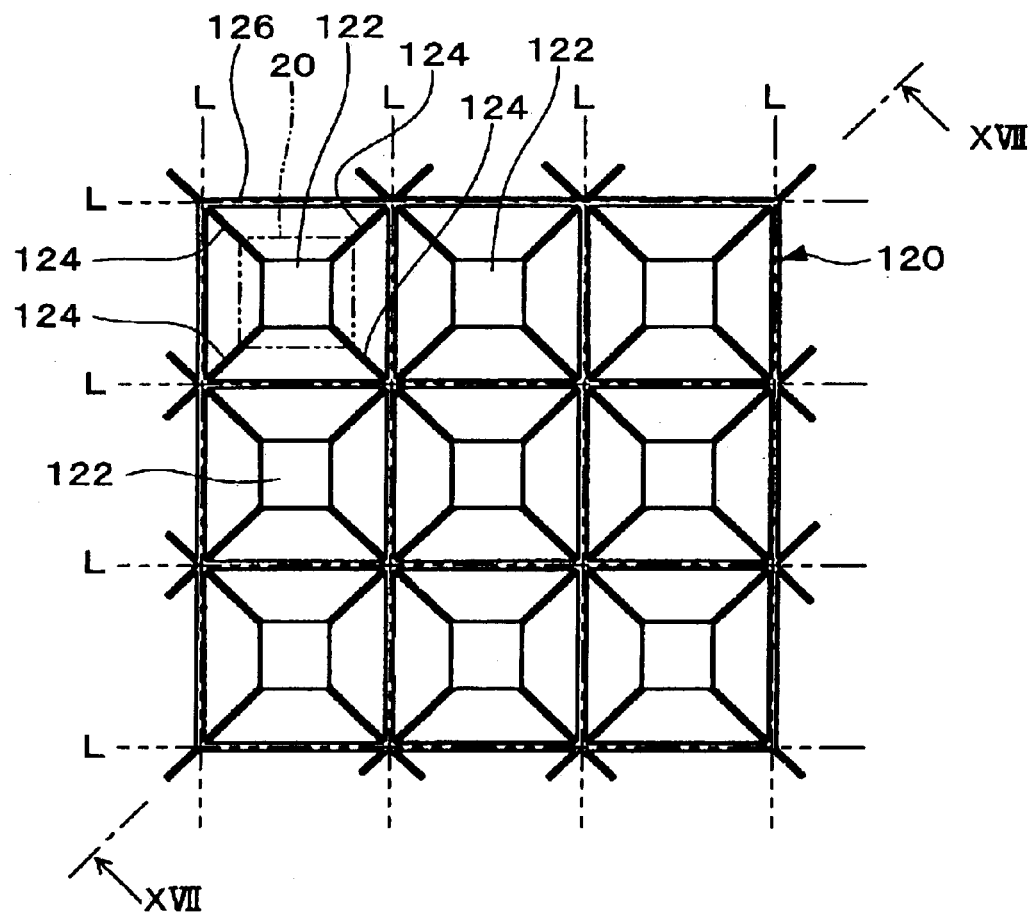
FIG. 16 is a plan view showing a seventh embodiment of the invention with multiple heat sinks suspended by supports and an outside heat sink frame.

The heat sink set 120 can be formed in the shape shown in FIG. 16 by processing a sheet material. The sheet could be processed chemically by etching, or physically by pressing or stamping. A lead frame manufacturing process could be used, for example.

The planar shape of the heat sink 122 can be smaller than the planar shape of the semiconductor chip 20. If, for example, multiple electrodes are formed on the sides of the semiconductor chip 20, the heat sink 122 can be shaped so that it fits inside the area enclosed by the multiple electrodes. This avoids contact between at least the heat sink 122 and wires 24. The heat radiation of the semiconductor chip 20 can also be improved because the thickness of the heat sink 122 can be desirably determined without being restricted by the height of the wire 24 loops. It should be noted that the heat sink 122 can also be disposed so that it does not contact the surface of the semiconductor chip 20.

The heat sink 122 is square (or triangular, rectangular, or other polygon). The heat sink 122 is further preferably shaped similarly to the rectangular semiconductor chip 20 (indicated by the broken line in FIG. 16). The heat sink 122 may also be circular or shaped otherwise.

Each heat sink 122 is preferably suspended by plural supports 124. The supports 124 further connect multiple heat sinks 122. The supports 124 may suspend the heat sink 122 from positions corresponding to the corners of the semiconductor chip 20. The supports 124 can thus be located avoiding the wires 24 bonded to the semiconductor chip 20, thereby avoiding contact between the wires 24 and the supports 124. The supports 124 can support multiple corners of the polygonal heat sink 122, and in the example shown in FIG. 16 suspend the rectangular heat sink 122 from its four corners.

The outside frame 126 of the heat sink 122 is aligned with the dicing lines L. More specifically, the heat sink set 120 is cut along the outside frame 126 after the sealing process. The strength of the heat sink set 120 is assured by providing the outside frame 126, making it easier to handle the heat sink set 120.

Figure 17:
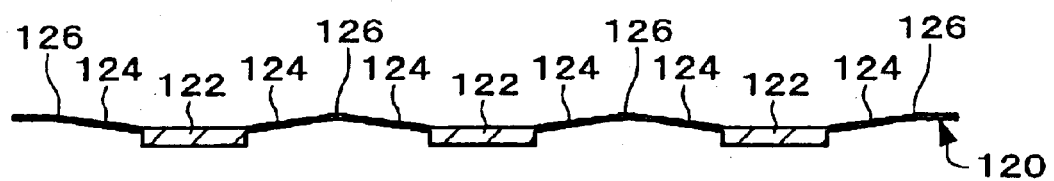
FIG. 17 is a sectional view along the line XVII–XVII of FIG. 16 showing the seventh embodiment of the invention.

FIG. 17 is a sectional view through line XVII—XVII in FIG. 16. As shown in FIG. 17 the heat sink 122 part can be shifted in a specific direction (a direction towards one side of the heat sink 122, specifically the top as seen in FIG. 17) by the supports 124. The multiple heat sinks 122 can be shifted by appropriately bending the supports 124.

Figure 20:
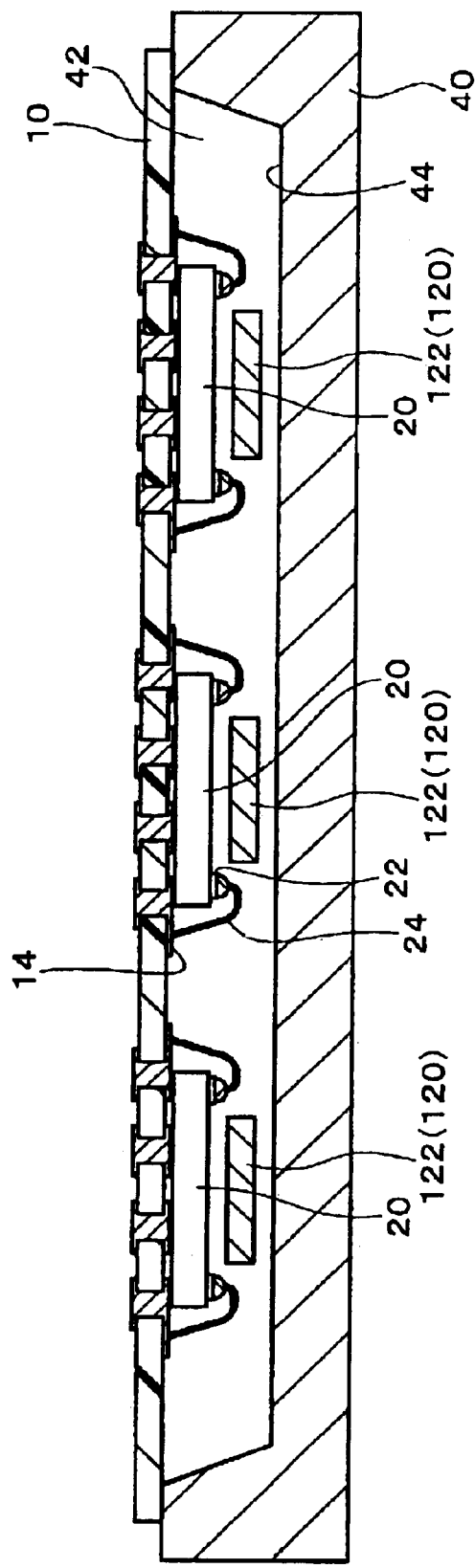
FIG. 20 is a cross-sectional view showing the seventh embodiment of the invention with the heat sink set in the cavity of the mold.

As shown in FIG. 20 the heat sink set 120 is then set in the cavity 42 of the mold 40. More specifically, the shifted side of the heat sink 122 is set facing the open side of the cavity 42. The heat sink 122 can thereby be covered with sealant on the side away from the substrate 10. The heat sink 122 can also be located closer to the semiconductor chip 20, thereby improving heat radiation from the semiconductor chip 20.

Figure 21:
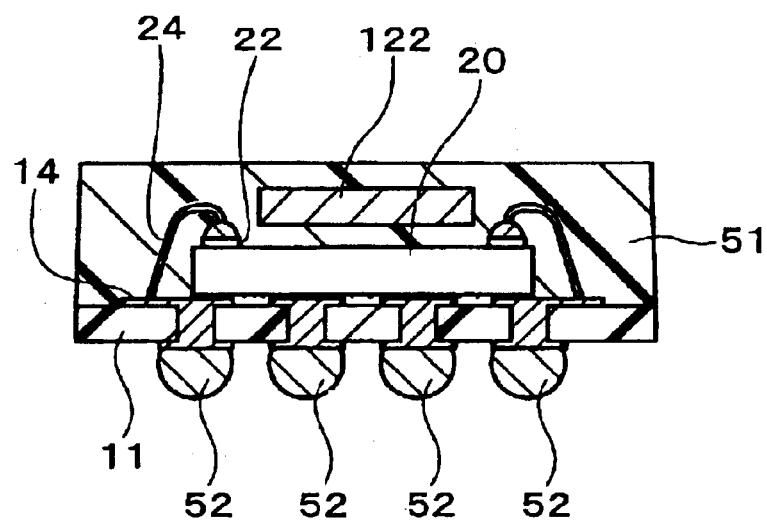
FIG. 21 is a cross-sectional view showing the seventh embodiment of the invention with the heat sink in an individual semiconductor device.

Other specific processes such as sealing and dicing are then performed to obtain the individual semiconductor devices as shown in FIG. 21.

The heat sink 122 can be disposed to a flat part of the semiconductor device with this embodiment of the invention. The size and weight of the semiconductor device can thereby be reduced. The heat sink 122 can, for example, be positioned away from the wires 24 bonded to the semiconductor chip 20. The heat sink 122 can thereby be prevented from interfering with electrical signals carried through the wires 24.

Figure 18:
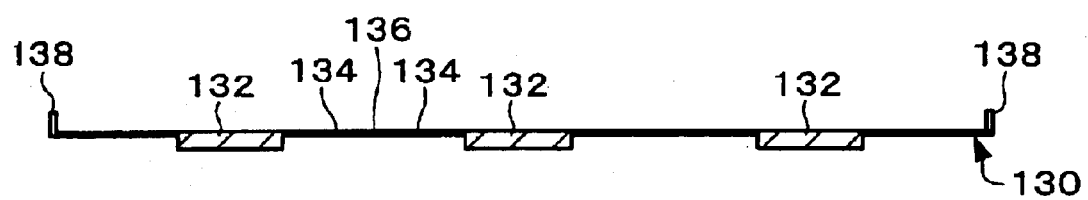
FIG. 18 shows a variation of the seventh embodiment of the invention shown in FIG. 17.
Figure 19:
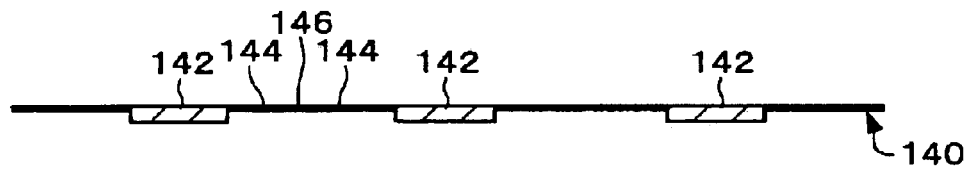
FIG. 19 shows another variation of the seventh embodiment of the invention shown in FIG. 17.

FIG. 18 and FIG. 19 show an alternative version of this heat sink set.

As shown in FIG. 18 the heat sink set 130 includes multiple heat sinks 132, supports 134, and outside frame 136, and has a lip 138 formed along the outside edge. The heat sink 132 parts of the 130 can thus be supported above the bottom of the mold cavity by the lip 138. This lip 138 is as in the fifth embodiment described above.

As shown in FIG. 19 the heat sink set 140 can include multiple heat sinks 142, supports 144, and outside frame 146 without offsetting the heat sink 142. If the heat sinks 142 protrude from the other parts as shown in FIG. 19, the side to which they protrude (the bottom in FIG. 19) can be placed facing the substrate 10.

Embodiment 8

Figure 22:
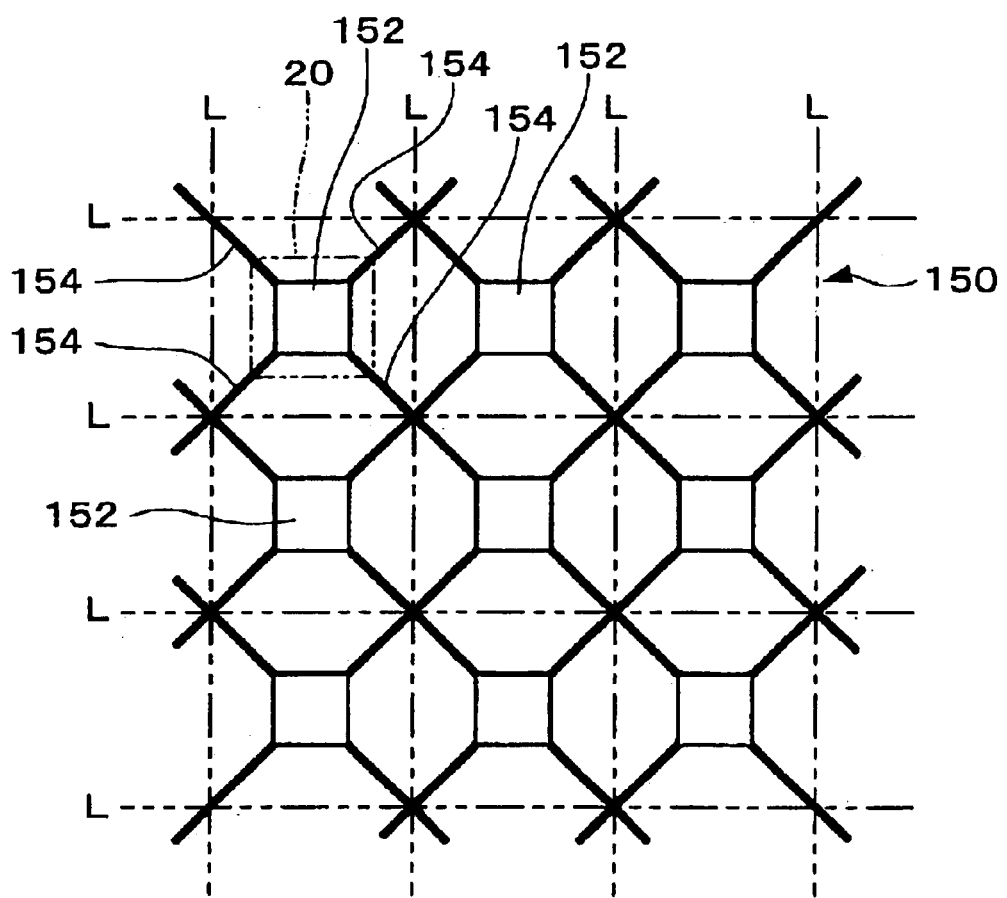
FIG. 22 is a plan view showing an eighth embodiment of the invention with multiple heat sinks suspended by supports but without the outside heat sink frame of the seventh embodiment.

FIG. 22 shows a heat sink set used in an eighth embodiment of the invention. This embodiment differs from the seventh in that the outside frame is omitted. A heat sink set 150 according to this embodiment therefore has multiple heat sinks 152, and supports 154 for supporting the multiple heat sinks 152 in part. The multiple heat sinks 152 and supports 154 are as described above.

As shown in FIG. 22 the supports 154 extend in a direction intersecting the dicing lines L. Only the supports 154 are located on the dicing lines L. Because the supports 154 thus intersecting the dicing lines L are then cut to separate the semiconductor devices, the heat sink set 150 can be easily cut, thereby helping to stabilize the quality of the semiconductor devices. More specifically, the heat sink set 150 can be cut without leaving any cutting waste.

Embodiment 9

Figure 23:
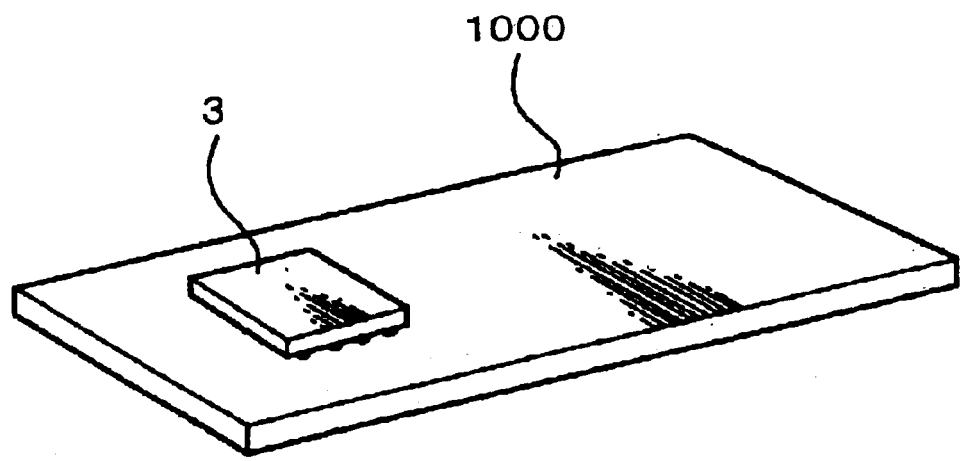
FIG. 23 shows a circuit board according to a ninth embodiment of the invention in which the semiconductor device of the present invention is utilized.

FIG. 23 shows a circuit board to which the embodiments described above can be applied. A semiconductor device 3 is mounted on the circuit board 1000. The circuit board 1000 is commonly an organic circuit board made of glass epoxy, for example. A wiring pattern of copper, for example, is formed to produce the desired circuits on the circuit board 1000, and the external electrodes of this semiconductor device 3 are bonded to this wiring pattern.

Figure 24:
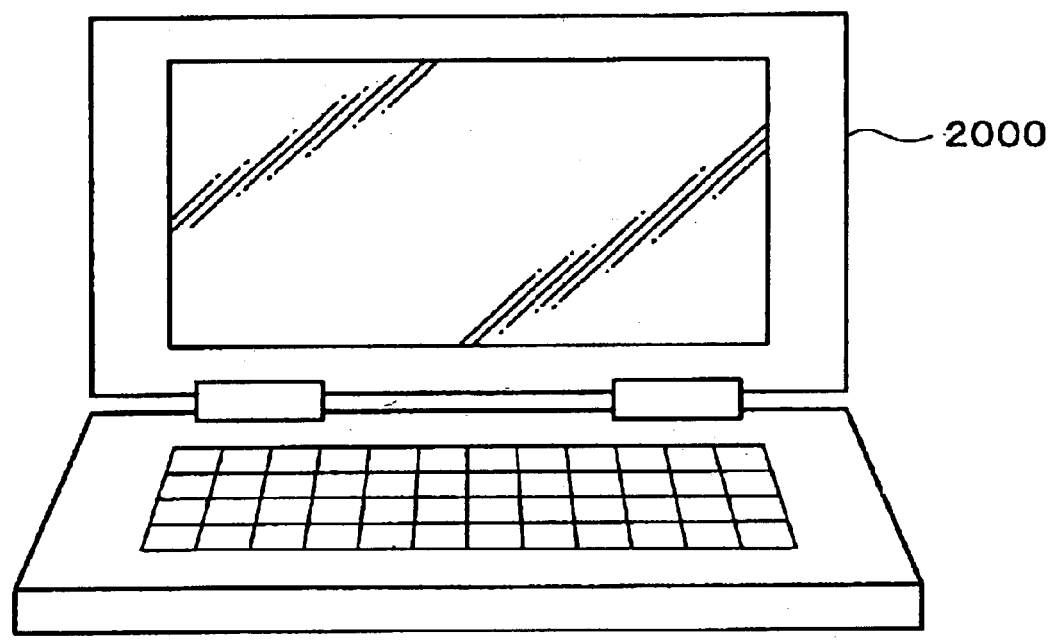
FIG. 24 shows an electronic device according to a ninth embodiment of the invention in which the semiconductor device of the present invention is utilized.
Figure 25:
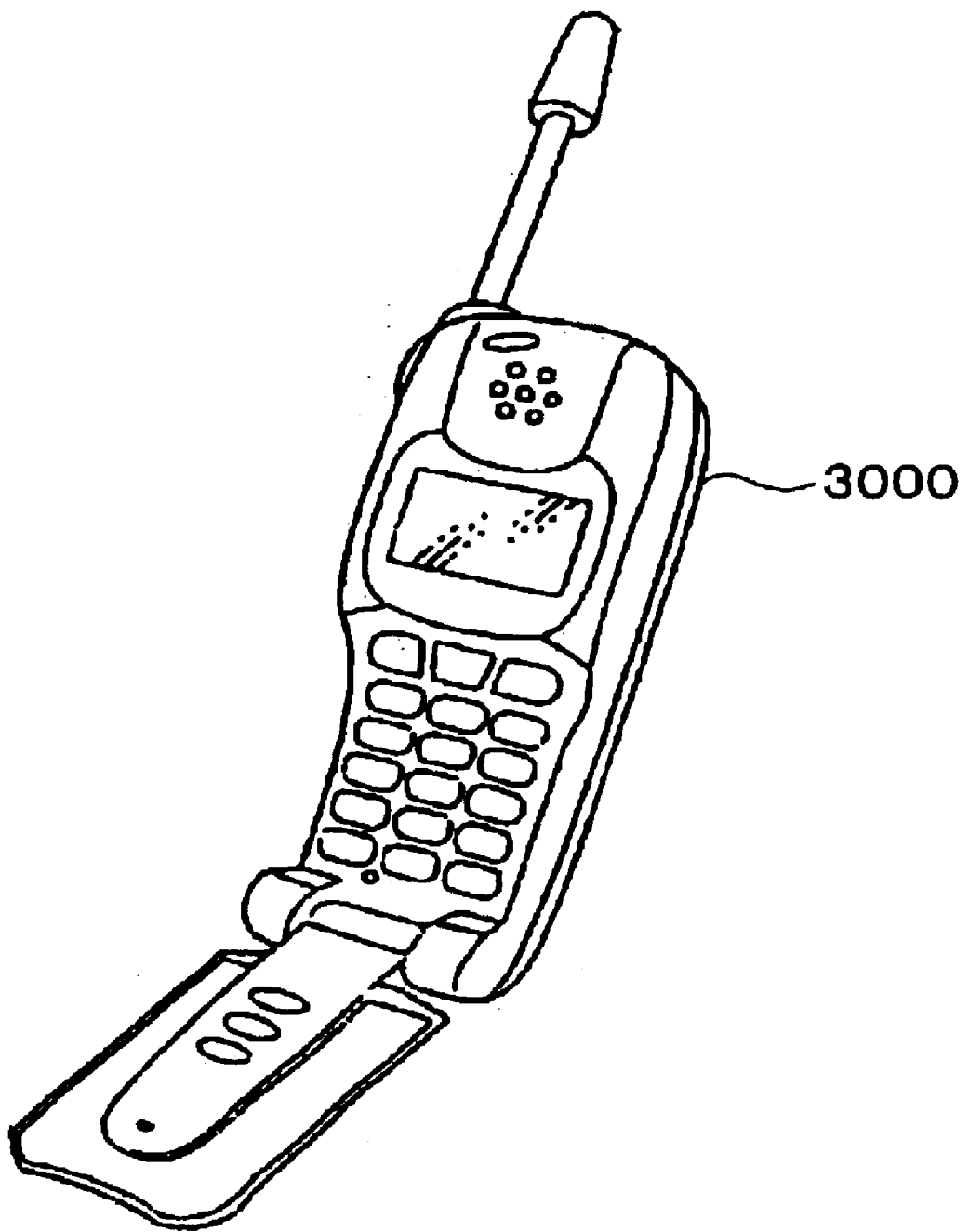
FIG. 25 shows another electronic device according to a ninth embodiment of the invention in which the semiconductor device of the present invention is utilized.

One example of an electronic device having a semiconductor device according to the present invention is a notebook type personal computer 2000 as shown in FIG. 24, and another is a cell phone 3000 as shown in FIG. 25.

The present invention shall not be limited to the embodiments described above and can be varied in many ways. The invention includes, for example, configurations practically identical to the configurations described in the above embodiments, including configurations of the same function, method, and result, or configurations of the same object and result. The invention also includes configurations replacing parts not fundamental to the configurations of the embodiments described above. Yet further, the invention includes configurations having the same operational effect and configurations capable of achieving the same object as the configurations described in the above embodiments. Yet further, the invention includes configurations adding known technology to the configurations described in the above embodiments.

What is claimed is:

1. A manufacturing method for a semiconductor device comprising:

(a) setting a heat radiation body set, which is an integral set of multiple heat radiation bodies, in a mold cavity;

(b) setting a substrate on which multiple semiconductor chips are mounted in a planar arrangement in the mold so that the multiple semiconductor chips are located inside the cavity; and (c) sealing the multiple semiconductor chips and affixing the set of multiple heat radiation bodies by filling the cavity with a sealant; and wherein in step (a) a heat radiation body part of the heat radiation body set is placed in contact with a bottom surface of the mold cavity.

2. A manufacturing method for a semiconductor device comprising:

(a) setting a heat radiation body set, which is an integral set of multiple heat radiation bodies, in a mold cavity;

(b) setting a substrate on which multiple semiconductor chips are mounted in a planar arrangement in the mold so that the multiple semiconductor chips are located inside the cavity; and (c) sealing the multiple semiconductor chips and affixing the set of multiple heat radiation bodies by filling the cavity with a sealant; and wherein a raised lip is formed on the outside of the heat radiation body set, and in step (a) the heat radiation body part of the heat radiation body set is raised above a bottom surface of the mold cavity by the raised lip.

3. A manufacturing method for a semiconductor device as described in claim 1, wherein a protuberance is formed in the heat radiation body part of the heat radiation body set, and in step (a) the heat radiation body set is placed with the protuberance facing the open side of the cavity.

4. A manufacturing method for a semiconductor device as described in claim 1, wherein at least one surface of the heat radiation body set is a rough surface.

5. A manufacturing method for a semiconductor device as described in claim 1, wherein a plurality of through-holes is formed in the heat radiation body part of the heat radiation body set.

6. A manufacturing method for a semiconductor device as described in claim 1, and (d) producing individual pieces having a heat radiation body by cutting alone cutting lines the sealant and substrate together with the heat radiation body set; and wherein ribs with a substantially continuous longitudinal section are formed in the heat radiation body set along the cutting lines followed in step (d), and in step (d) the heat radiation body is exposed at the top part and side part of the individual pieces by cutting the ribs.

7. A manufacturing method for a semiconductor device as described in claim 1, and (d) producing individual pieces having a heat radiation body by cutting alone cutting lines the sealant and substrate together with the heat radiation body set; and wherein support parts for interconnecting multiple heat radiation bodies and suspending the heat radiation bodies in part are formed in the heat radiation body set, and wherein the support parts are formed to intersect the cutting lines followed in step (d), and in step (d) the support parts of the heat radiation body set are cut.

8. A manufacturing method for a semiconductor device as described in claim 1, and (d) producing individual pieces having a heat radiation body by cutting alone cutting lines the sealant and substrate together with the heat radiation body set; and wherein an outside frame for the heat radiation bodies, and support parts for connecting the heat radiation bodies and outside frame and supporting the heat radiation bodies in part, are formed in the heat radiation body set, and wherein the outside frame extends along the cutting lines followed in step (d), and in step (d) the outside frame part of the heat radiation body set is cut.

9. A manufacturing method for a semiconductor device as described in claim 1, wherein support parts for interconnecting multiple heat radiation bodies and suspending the heat radiation bodies in part are formed in the heat radiation body set.

10. A manufacturing method for a semiconductor device as described in claim 9, wherein the outside shape of the semiconductor chips is square-shaped, and the support parts are formed at positions corresponding to corners of the semiconductor chips.

11. A manufacturing method for a semiconductor device as described in claim 10, wherein the outside shape of the heat radiation body part of the heat radiation body set is square-shaped, and the support parts suspend multiple corner parts in the heat radiation body part of the heat radiation body set.

12. A manufacturing method for a semiconductor device as described in claim 9, wherein the heat radiation body parts of the heat radiation body set are shifted in a specific direction by the support parts, and in step (a) the side to which the heat radiation bodies are shifted is set facing the open side of the cavity.

13. A manufacturing method for a semiconductor device as described in claim 1, wherein an outside frame for the heat radiation bodies, and support parts for connecting the heat radiation bodies and outside frame and supporting the heat radiation bodies in part, are formed in the heat radiation body set.

14. A manufacturing method for a semiconductor device as described in claim 7, wherein the heat radiation body parts of the heat radiation body set are shifted in a specific direction by the support parts, and in step (a) the side to which the heat radiation bodies are shifted is set facing the open side of the cavity.

15. A manufacturing method for a semiconductor device as described in claim 2, wherein a protuberance is formed in the heat radiation body part of the heat radiation body set, and in step (a) the heat radiation body set is placed with the protuberance facing the open side of the cavity.

16. A manufacturing method for a semiconductor device as described in claim 2, wherein at least one surface of the heat radiation body set is a rough surface.

17. A manufacturing method for a semiconductor device as described in claim 2, wherein a plurality of through-holes is formed in the heat radiation body part of the heat radiation body set.

18. A manufacturing method for a semiconductor device as described in claim 2, and
- (d) producing individual pieces having a heat radiation body by cutting along cutting lines the sealant and substrate together with the heat radiation body set; and
- wherein ribs with a substantially continuous longitudinal section are formed in the heat radiation body set along the cutting lines followed in step (d), and
- in step (d) the heat radiation body is exposed at the top part and side part of the individual pieces by cutting the ribs.

19. A manufacturing method for a semiconductor device as described in claim 2, and
- (d) producing individual pieces having a heat radiation body by cutting along cutting lines the sealant and substrate together with the heat radiation body set; and
- wherein support parts for interconnecting multiple heat radiation bodies and suspending the heat radiation bodies in part are formed in the heat radiation body set, and wherein the support parts are formed to intersect the cutting lines followed in step (d), and
- in step (d) the support parts of the heat radiation body set are cut.

20. A manufacturing method for a semiconductor device as described in claim 2, and
- (d) producing individual pieces having a heat radiation body by cutting along cutting lines the sealant and substrate together with the heat radiation body set; and
- wherein an outside frame for the heat radiation bodies, and support parts for connecting the heat radiation bodies and outside frame and supporting the heat radiation bodies in part, are formed in the heat radiation body set, and wherein the outside frame extends along the cutting lines followed in step (d), and
- in step (d) the outside frame part of the heat radiation body set is cut.

21. A manufacturing method for a semiconductor device as described in claim 2, wherein support parts for interconnecting multiple heat radiation bodies and suspending the heat radiation bodies in part are formed in the heat radiation body set.

22. A manufacturing method for a semiconductor device as described in claim 21, wherein the outside shape of the semiconductor chips is square-shaped, and
- the support parts are formed at positions corresponding to corners of the semiconductor chips.

23. A manufacturing method for a semiconductor device as described in claim 22, wherein the outside shape of the heat radiation body part of the heat radiation body set is square-shaped, and
- the support parts suspend multiple corner parts in the heat radiation body part of the heat radiation body set.

24. A manufacturing method for a semiconductor device as described in claim 21, wherein the heat radiation body parts of the heat radiation body set are shifted in a specific direction by the support parts, and
- in step (a) the side to which the heat radiation bodies are shifted is set facing the open side of the cavity.

25. A manufacturing method for a semiconductor device as described in claim 2,
- wherein an outside frame for the heat radiation bodies, and support parts for connecting the heat radiation bodies and outside frame and supporting the heat radiation bodies in part, are formed in the heat radiation body set.

26. A manufacturing method for a semiconductor device as described in claim 19, wherein the heat radiation body parts of the heat radiation body set are shifted in a specific direction by the support parts, and
- in step (a) the side to which the heat radiation bodies are shifted is set facing the open side of the cavity.

* * * * *